(12) United States Patent
Fulcheri et al.

(10) Patent No.: US 11,018,459 B2
(45) Date of Patent: May 25, 2021

(54) PROTECTION CIRCUIT AGAINST HIGH VOLTAGES FOR USB TYPE C RECEIVER

(71) Applicant: STMicroelectronics (Rousset) SAS, Rousset (FR)

(72) Inventors: Patrick Fulcheri, Biot (FR); Kenichi Oku, Grasse (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 224 days.

(21) Appl. No.: 16/055,819

(22) Filed: Aug. 6, 2018

(65) Prior Publication Data

US 2019/0074639 A1 Mar. 7, 2019

(30) Foreign Application Priority Data

Sep. 1, 2017 (FR) ...................................... 1758085

(51) Int. Cl.
| | | |
|---|---|---|
| *H01R 13/66* | (2006.01) | |
| *G06F 13/40* | (2006.01) | |
| *G01R 19/257* | (2006.01) | |
| *H02H 3/20* | (2006.01) | |
| *G01R 15/04* | (2006.01) | |
| *G06F 1/26* | (2006.01) | |

(52) U.S. Cl.
CPC ....... *H01R 13/6666* (2013.01); *G01R 19/257* (2013.01); *G06F 13/4072* (2013.01); *H02H 3/20* (2013.01); *G01R 15/04* (2013.01); *G06F 1/26* (2013.01)

(58) Field of Classification Search
None
See application file for complete search history.

(56) References Cited

U.S. PATENT DOCUMENTS

| | | | | |
|---|---|---|---|---|
| 2017/0115362 A1* | 4/2017 | Latham | .................. | G01R 33/07 |
| 2017/0139871 A1* | 5/2017 | Yeh | ...................... | G06F 13/4081 |
| 2017/0155214 A1* | 6/2017 | Shen | .................... | H01R 13/6666 |
| 2017/0177523 A1* | 6/2017 | Rotchford | ............. | G06F 1/3203 |
| 2017/0346240 A1* | 11/2017 | Oporta | ................... | H01R 24/60 |
| 2018/0024899 A1* | 1/2018 | Degura | ................... | G06F 13/00 |
| | | | | 358/520 |
| 2018/0205243 A1* | 7/2018 | Chung | .................. | H02J 7/0029 |
| 2018/0254648 A1* | 9/2018 | Harju | .................... | H02J 7/0072 |

FOREIGN PATENT DOCUMENTS

CN 106300314 A 1/2017

* cited by examiner

*Primary Examiner* — Jeffrey A Gblende
(74) *Attorney, Agent, or Firm* — Slater Matsil, LLP

(57) ABSTRACT

A USB Type-C receiver device, includes: a port including a channel configuration input; a ground pin; and a protection circuit for protection against high voltages on the channel configuration input, wherein the protection circuit includes a resistive circuit coupled between the channel configuration input and the ground terminal and configured to form both a voltage divider and a resistive pull-down circuit coupled between the channel configuration input and the ground pin.

20 Claims, 1 Drawing Sheet

PROTECTION CIRCUIT AGAINST HIGH VOLTAGES FOR USB TYPE C RECEIVER

CROSS-REFERENCE TO RELATED APPLICATIONS

This application claims priority to French Patent Application No. 1758085, filed on Sep. 1, 2017, which application is hereby incorporated herein by reference.

TECHNICAL FIELD

This disclosure relates generally to universal serial bus (USB) devices, and in particular embodiments to a protection circuit against high voltages for a USB type C receiver.

BACKGROUND

Theoretically, USB 3.1 Type-C devices supporting the USB power delivery mode allow data rates up to 10 GB/s and up to 100 W of power to be delivered with a maximum voltage of 20 V and a maximum current of 5 A. The power to be delivered between two USB 3.1 PD Type-C devices is negotiable via specific controllers and the electrical power supply may advantageously be bidirectional between various USB 3.1 Type-C devices.

A USB Type-C cable is generally designed to be coupled and establish a power supply and communication line between what is termed a USB PD Type-C "source" device and what is termed a USB PD Type-C "receiver" device.

The source device is capable of adjusting the value of the supply voltage within a range of 0 to 20 V.

High voltages, typically between 5 volts and 20 volts, may be present on the channel configuration pins of the connector of the receiver.

It is therefore recommended by the USB standard to connect a circuit for protection against these high voltages to these pins, so as to protect receivers that are not capable of supporting such voltages on the channel configuration pins.

The standard currently proposes connecting high-voltage transistors between the channel configuration pins, the current detection stage and the connection detection stage. These transistors are designed to limit then the voltage at these stages to around 2.7 volts for a voltage at input of around 25 volts.

However, for certain applications, these transistors are too expensive and/or too bulky, in particular for very simple applications consisting for example in charging a receiver, for example a smartphone, a tablet or a laptop computer using a USB Type-C charger.

Therefore, in certain products, in particular low-cost products, these protection devices are simply omitted, which negatively affects the reliability of these products and may result in them not conforming to the USB 3.1 PD standard.

There is therefore a need to provide a circuit for protection against the high voltages that are potentially present on the channel configuration terminals of the receiver that is simple to implement, inexpensive and compact.

The USB 3.1 standard additionally recommends that the receiver be provided with a resistive pull-down circuit on the channel configuration pins, each pull-down resistor having a nominal value, typically 5100 ohms, to within 10%.

These pull-down resistors make it possible for the source device, for example a charger, to detect that a connection has indeed been established with a receiver device and that there is no non-conformity present in this receiver device. Such a non-conformity may for example be the result of a defective battery in the receiver device, for example a fully discharged battery or a battery in safe mode which is not capable of providing a minimum operating voltage.

In order to detect a potential non-conformity, the source device delivers a current having a predefined value over the channel configuration pins and the measured voltage across these pins must be located within a predefined range taking account of the predefined value of the pull-down resistor.

SUMMARY

Embodiments relate to universal serial bus devices compatible with the USB 3.1 standard supporting the USB power delivery mode (PD mode) and including reversible connectors which do not impose any connection orientation, commonly known to those skilled in the art by the name C-Type, more particularly to protection against high voltages, typically voltages higher than 5 volts and potentially up to 20 volts, that are liable to be present on the channel configuration pins of USB Type-C receiver devices.

According to one embodiment, it is proposed to configure a resistive pull-down circuit such that it forms a circuit for protection against high voltages while carrying out the function of a pull-down circuit recommended by the USB Type-C standard.

According to one aspect, a USB Type-C receiver device is proposed, including a port including a channel configuration input, a resistive pull-down circuit coupled between the channel configuration input and a ground pin and a stage for protection against high voltages on the channel configuration input.

The protection stage includes a resistive circuit coupled between the channel configuration input and the ground terminal and configured to form both a voltage divider and the resistive pull-down circuit.

Thus, the resistive circuit of the protection stage fulfills two functions, namely a voltage divider function, which makes it possible to limit the voltage at the output of the voltage divider (and hence to protect the components located downstream of this protection stage against high voltages, typically higher than 5 volts, that are present on the channel configuration input), and the function of a resistive pull-down circuit specified by the USB standard.

As mentioned above, the resistive value of the resistive pull-down circuit is equal to a nominal value, typically 5100 ohms, to within 10%.

According to one embodiment, the channel configuration input includes two channel configuration pins.

The resistive circuit includes then two resistive voltage divider bridges that are coupled between the two channel configuration pins and the ground terminal, respectively.

Each resistive voltage divider bridge includes a first resistive element coupled to the corresponding channel configuration terminal and a second resistive element coupled between the first resistive element and the ground terminal.

The common node between the first resistive element and the second resistive element forms an output of the resistive voltage divider bridge.

The resistive value of the first resistive element is equal to said nominal value to within 10% while the resistive value of the second resistive element is non-zero and the sum of the resistive values of the two resistive elements is equal to the nominal value to within 10%.

Thus, the resistive value between a channel configuration pin and the ground terminal is indeed equal to the nominal value (5100 ohms) to within 10%.

Furthermore, a voltage measurement circuit may advantageously be coupled to the output of each voltage divider bridge. Additionally, when this voltage measurement circuit is not being supplied with power, the second resistive element of each resistive voltage divider bridge may then be considered to have been shorted. However, this does not present a problem with respect to the USB standard since in this case, the resistor connected between the corresponding channel configuration pin and the ground pin is then formed from the first resistive element, the resistive value of which is equal to the nominal value (5100 ohms) to within 10%.

It may therefore be seen that numerous resistance values are possible for forming the one or more divider bridges.

However, the division factor between the voltage present on a channel configuration pin and the voltage at the output of the resistive voltage divider bridge is equal to the ratio between the resistive value of the second resistive element and the sum of the resistive values of these two resistive elements.

Additionally, for certain resistance values, this division factor may be too small, thereby presenting a problem in terms of accuracy for measuring the voltage at the output of the voltage divider bridge, in particular if it is desired to use an analog-to-digital converter as the voltage measurement circuit.

Therefore, according to one preferred embodiment amounting to an acceptable trade-off, a value equal to 4590 ohms could be chosen as the resistive value of the first resistive element and a value equal to 510 ohms could be chosen as the resistive value of the second resistive element.

This results in a division factor equal to $1/10$, which makes it possible, for voltages present at the input of the corresponding voltage divider bridge that are equal to 20 volts, to limit the voltage to 2 volts at the output of the divider bridge, while observing the USB standard with respect to pull-down resistors.

Furthermore, when the voltage measurement circuit includes an analog-to-digital converter including two inputs that are connected to the two outputs of the two resistive voltage divider bridges, respectively, the values mentioned above for the two resistive elements advantageously make it possible to use a 12-bit analog-to-digital converter, which component is widely available on the market, or even a more accurate converter over more than 12 bits.

According to another aspect, an electronic apparatus, for example a cellular mobile telephone, tablet, or laptop computer, is proposed, including at least one receiver device such as defined above.

BRIEF DESCRIPTION OF THE DRAWINGS

Other advantages and features of the invention will become apparent upon examining the detailed description of completely non-limiting embodiments and the appended drawings, in which.

DETAILED DESCRIPTION OF ILLUSTRATIVE EMBODIMENTS

Figure 1:
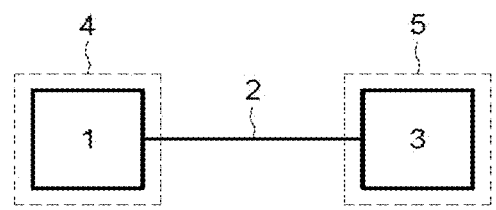
FIGS. 1 and 2 schematically illustrate embodiments of the invention.

FIG. 1 schematically illustrates an electronic apparatus 4, in this case for example a desktop or laptop computer, including at least one USB Type-C source device 1 capable of charging, via a USB Type-C cable 2, a USB Type-C receiver device 3, for example incorporated within a cellular mobile telephone or a tablet.

The device 4 could also simply be a charger capable of being connected to a power supply network, such as a 220 volt network by way of non-limiting example.

The receiver device 3 (shown in greater detail in FIG. 2) includes a connector or port 30 typically possessing a channel configuration input having here two channel configuration pins CC1 and CC2, multiple supply voltage pins VBUS, of which only one is shown here for the sake of simplicity, and multiple ground pins GND, for example four ground pins, of which only one is shown here for the sake of simplicity.

According to the USB 3.1 Type-C standard, all of the pins of the same type are symmetrical with respect to the center of the connector 30 such that the connector 30 does not impose any connection orientation on the USB Type-C cable. The connector of the cable includes a single channel configuration pin which, depending on the connection orientation, will make contact either with the pin CC1 or with the pin CC2 of the receiver device 3.

According to the USB Type-C standard, the supply voltage Vin present on the input VBUS may reach values as high as 20 volts. Consequently, such high voltage values may also be present on the channel configuration pins CC1 and CC2.

As such, a stage 31 for protection against such high voltages, typically voltages higher than 5 volts, is provided. This protection stage 31 includes a resistive circuit coupled between the channel configuration input, i.e. in this instance the two pins CC1 and CC2, and the ground terminal GND and configured to form both a voltage divider and a resistive pull-down circuit.

More specifically, the resistive circuit includes here two resistive divider bridges 311 and 312.

The first resistive divider bridge 311 is coupled between the channel configuration pin CC1 and the ground terminal while the second resistive divider bridge 312 is coupled between the channel configuration pin CC2 and the ground terminal.

The first divider bridge 311 includes a first resistive element R11 coupled to the channel configuration pin CC1 and a second resistive element R21 coupled between the first resistive element R11 and the ground terminal GND.

The common node ND1 between the two resistive elements R11 and R21 forms the output of the first resistive divider bridge 311.

The second resistive divider bridge 312 includes a first resistive element R12 connected to the channel configuration pin CC2 and a second resistive element R22 connected between the first resistive element R12 and the ground terminal GND, the common node ND2 between these two resistive elements forming the output terminal of this second divider bridge 312.

In this embodiment, the resistive value of each of the first resistive elements R11 and R12 is equal to 4590 ohms, which represents 90% of the nominal value of 5100 ohms envisaged for a pull-down resistor in the USB standard.

The resistive value of each of the second resistive elements R21 and R22 is here equal to 510 ohms.

Consequently, the resistive value of the pathway between each channel configuration terminal CC1 and the ground terminal is equal to 5100 ohms.

The requirements defined by the USB 3.1 standard in terms of pull-down resistance are therefore met.

Furthermore, as will be seen in greater detail below, an analog-to-digital converter 32 is connected to the outputs ND1 and ND2 of the two resistive divider bridges. Additionally, when this converter 32 is not being supplied with power, the resistive elements R21 and R22 may be considered to have been shorted. The resistive value seen then between each channel configuration terminal CC1 and the ground terminal GND is then equal to 4590 ohms, which corresponds to the nominal value of 5100 ohms minus 10%.

Consequently, the requirements of the USB 3.1 standard in terms of pull-down resistance are met in this case as well.

Furthermore, the voltage present on the output node NDi is equal in this example to $\frac{1}{10}$ of the voltage present at the corresponding channel configuration terminal CC1 (the pin CC1 or CC2 depending on the connection orientation of the connector of the cable). Specifically, this division factor is equal to 510÷(4590+510).

The resistive circuit 31 therefore also forms a circuit for protection against the high voltages that are potentially present on the channel configuration pins CC1 or CC2.

Thus, even if there is a voltage of the order of 20 volts on the pin CC1 or CC2 (depending on the connection orientation of the connector of the cable), a voltage of the order of 2 volts will be obtained at the corresponding output node NDi.

Furthermore, the USB 3.1 Type-C standard provides for an informative current to flow continuously through the channel configuration pin of the source device, so as to indicate the maximum current able to be delivered by the USB Type-C source device.

This informative current gives rise to an informative voltage at the channel configuration pin CC1 or CC2 of the receiver device 3, which voltage, when it is measured by the circuit 32, makes it possible to determine the power delivered by the source device 1.

It should be noted that the range of permissible voltages delivered by the source device to the channel configuration pin CC1 or CC2 of the receiver device 3 may reach 2.04 volts.

Thus, a voltage between 0.25 volts and 0.61 volts is representative of a USB current fault while a voltage between 0.70 volts and 1.16 volts is representative of a current supply of 1.5 amperes by the source device and a voltage between 1.31 volts and 2.04 volts is representative of a current supply of 3 amperes by the source device.

Of course, the presence of the voltage divider bridge 311 or 312 divides the voltage present at the terminal CC1 or CC2 by 10.

Consequently, in the present case, a voltage at the node ND1 or ND2 between 25 and 65 millivolts will be representative of a USB current fault while a voltage between 70 and 116 millivolts will be representative of a delivery of a current of 1.5 amperes by the source device and a voltage between 131 and 204 millivolts will be representative of a delivery of a current of 3 amperes by the source device.

However, these values, which may vary from 25 to 204 millivolts, may easily be measured by an analog-to-digital converter 32 with a reference voltage that is ideally equal to 2.048 volts, although a reference voltage of 3 volts is also possible, using a 12-bit converter or a more accurate converter over more than 12 bits.

Figure 2:
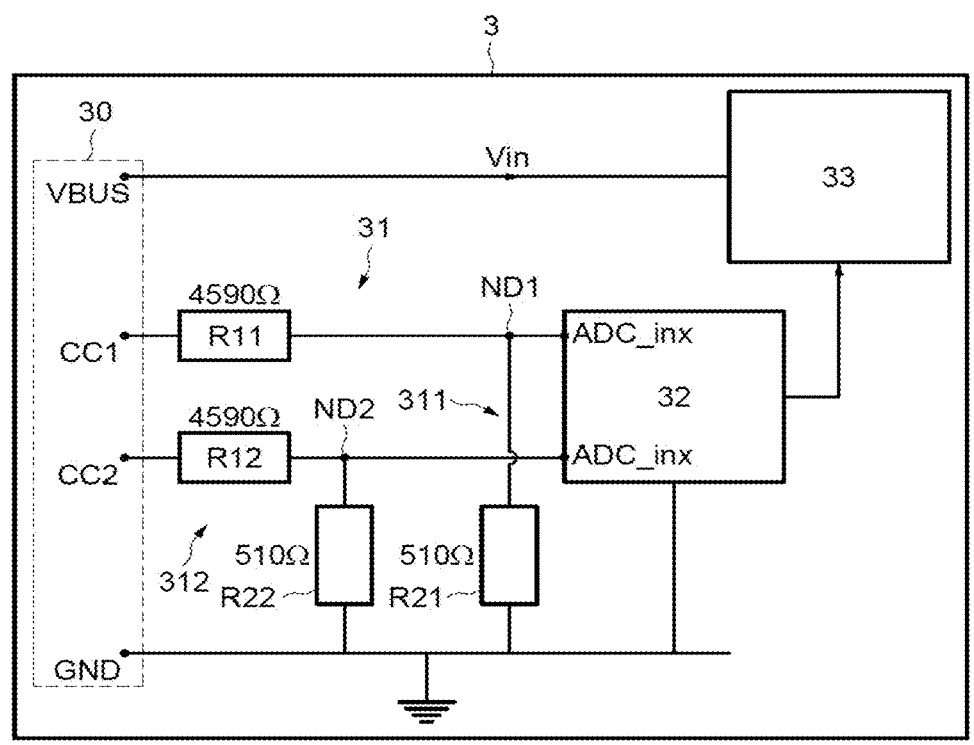

As illustrated in FIG. 2, the converter 32 possesses two inputs ADC_inx that are connected to the two output nodes ND1, ND2, respectively. However, only the input ADC_inx connected to the pin CCi that is actually connected to the channel configuration pin of the cable will be operational, of course.

Other voltage measurement circuits are possible.

It would thus be possible to replace the analog-to-digital converter with a set of analog comparators using various reference voltages of different values.

The voltage measurement information and the supply voltage Vin are transmitted to a processing stage 33, the structure of which is conventional and known per se and includes in particular a connection detection circuit and a USB controller.

What is claimed is:

1. A USB Type-C receiver device, comprising:
    a port including a channel configuration input;
    a ground terminal;
    a protection circuit for protection against high voltages on the channel configuration input, wherein the protection circuit comprises a resistive circuit coupled between the channel configuration input and the ground terminal and configured to form both a voltage divider and a resistive pull-down circuit coupled between the channel configuration input and the ground terminal;
    a voltage measurement circuit comprising an analog-to-digital converter coupled to an output of the voltage divider;
    wherein the channel configuration input comprises two channel configuration pins, and wherein the resistive circuit comprises two resistive voltage divider bridges that are coupled between the two channel configuration pins and the ground terminal, respectively; and
    wherein the analog-to-digital converter comprises two inputs that are respectively connected to outputs of the two resistive voltage divider bridges.

2. The device according to claim 1, wherein each resistive voltage divider bridge comprises a first resistive element coupled to a corresponding channel configuration pin and a second resistive element coupled between the first resistive element and the ground terminal.

3. The device according to claim 2, wherein a resistive value of the first resistive element is equal to a nominal value or is within 10% of the nominal value, and wherein a resistive value of the second resistive element is non-zero.

4. The device according to claim 3, wherein a sum of the resistive value of the first resistive element and the resistive value of the second resistive element is equal to the nominal value or is within 10% of the nominal value.

5. The device according to claim 4, wherein the nominal value is equal to 5100 ohms.

6. The device according to claim 5, wherein the resistive value of the first resistive element is equal to 4590 ohms and the resistive value of the second resistive element is equal to 510 ohms.

7. The device according to claim 1, wherein the analog-to-digital converter is at least a 12-bit analog-to-digital converter.

8. A system, comprising:
    an electronic apparatus comprising a charging device configured to be connected to a power supply network; and
    a receiver device coupled to the charging device, the receiver device comprising
        a port including a channel configuration input,
        a ground terminal,
        a protection circuit for protection against high voltages on the channel configuration input, wherein the protection circuit comprises a resistive circuit coupled between the channel configuration input and the ground terminal and configured to form both a voltage divider and a resistive pull-down circuit coupled between the channel configuration input and the ground terminal, a voltage measurement circuit comprising an analog-to-digital converter coupled to an output of the voltage divider, wherein the channel configuration input comprises two channel configuration pins, and wherein the resistive circuit comprises two resistive voltage divider bridges that are coupled between the two channel configuration pins and the ground terminal, respectively, and wherein the analog-to-digital converter comprises two inputs that are respectively connected to outputs of the two resistive voltage divider bridges.

9. The system according to claim 8, wherein the electronic apparatus comprises a desktop or laptop computer, and wherein the receiver device comprises a cellular mobile telephone or a tablet.

10. The system according to claim 8, wherein the receiver device is coupled to the charging device by a USB Type-C cable.

11. The system according to claim 8, wherein the receiver device comprises a USB Type-C receiver device.

12. The system according to claim 8, wherein a resistive value of the resistive pull-down circuit is equal to a nominal value or is within 10% of the nominal value.

13. The system according to claim 8, wherein the analog-to-digital converter is at least a 12-bit analog-to-digital converter.

14. A USB Type-C receiver device, comprising:
a port including a channel configuration input;
a ground terminal;
a protection circuit for protection against high voltages on the channel configuration input, wherein the protection circuit comprises a resistive circuit coupled between the channel configuration input and the ground terminal and configured to form both a voltage divider and a resistive pull-down circuit coupled between the channel configuration input and the ground terminal;

a voltage measurement circuit coupled an output of the voltage divider;

wherein a resistive value of the resistive pull-down circuit is equal to a nominal value or is within 10% of the nominal value;

wherein the channel configuration input comprises two channel configuration pins, and wherein the resistive circuit comprises two resistive voltage divider bridges that are coupled between the two channel configuration pins and the ground terminal, respectively; and wherein the voltage measurement circuit comprises an analog-to-digital converter comprising two inputs that are respectively connected to outputs of the two resistive voltage divider bridges.

15. The device according to claim 14, wherein the analog-to-digital converter is at least a 12-bit analog-to-digital converter.

16. The system according to claim 8, wherein each resistive voltage divider bridge comprises a first resistive element coupled to a corresponding channel configuration pin and a second resistive element coupled between the first resistive element and the ground terminal.

17. The system according to claim 16, wherein a resistive value of the first resistive element is equal to a nominal value or is within 10% of the nominal value, and wherein a resistive value of the second resistive element is non-zero.

18. The system according to claim 17, wherein a sum of the resistive value of the first resistive element and the resistive value of the second resistive element is equal to the nominal value or is within 10% of the nominal value.

19. The system according to claim 18, wherein the nominal value is equal to 5100 ohms.

20. The system according to claim 19, wherein the resistive value of the first resistive element is equal to 4590 ohms and the resistive value of the second resistive element is equal to 510 ohms.

* * * * *